(12) United States Patent
Kim (10) Patent No.: US 6,468,099 B2
(45) Date of Patent: Oct. 22, 2002

(54) SEMICONDUCTOR DEVICE FABRICATING METHOD

(75) Inventor: Myoung-Soo Kim, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/941,307

(22) Filed: Aug. 29, 2001

(65) Prior Publication Data

US 2002/0110968 A1 Aug. 15, 2002

(30) Foreign Application Priority Data

Feb. 13, 2000 (KR) .............................. 01-6909

(51) Int. Cl.[7] ................ H01L 21/8238; H01L 21/8234; H01L 21/76
(52) U.S. Cl. ................ 439/199; 438/221; 438/224; 438/225; 438/228; 438/275; 438/981; 438/425
(58) Field of Search ................. 438/199, 221, 438/223, 224, 225, 227, 228, 275, 276, 424, 425, 439, 981

(56) References Cited

U.S. PATENT DOCUMENTS 5,254,489 A * 10/1993 Nakata ................. 438/258
6,265,267 B1 * 7/2001 Huang ................. 438/258

* cited by examiner

Primary Examiner—Carl Whitehead, Jr.
Assistant Examiner—Toniae M. Thomas
(74) Attorney, Agent, or Firm—Mills & Onello, LLP

(57) ABSTRACT

A method of fabricating a semiconductor device applies a LOCOS profile characteristic to an edge portion of an STI in a HV region to thereby lower compressive stress that is concentrated on the side of the STI. A field oxide film is formed so that only edge portions of HV region (active region II) may be in contact with a comparatively stiff STI, and then, a thick gate oxide film is formed on the HV region by utilizing a nitride film as a mask. After the nitride film as a mask is removed, a thin gate oxide film is formed on a LV region (an active region I in which a thin gate oxide film is formed). As a result, a thinning phenomenon of a gate oxide film at an edge portion of STI is prevented that otherwise would occur when the gate oxide film for HV grows in a normal STI structure by utilizing a nitride film as a mask. The present invention also prevents compromise of the operational characteristics of a resulting transistor, which otherwise would be caused by the concentration of electric field and by the hump phenomenon.

11 Claims, 8 Drawing Sheets

SEMICONDUCTOR DEVICE FABRICATING METHOD

1. FIELD OF THE INVENTION

The present invention relates to a method of fabricating a semiconductor device by which a thickness of an oxide film is prevented from being relatively thinned at the boundary between a shallow trench isolation and a thick gate oxide film when a process of fabricating a dual gate oxide is applied to a normal shallow trench isolation.

2. DESCRIPTION OF THE RELATED ART

Since power devices such as a liquid crystal display (LCD) driver IC (LDI) require both low voltage (LV) operation for driving an associated logic circuit, together with high voltage (HV) operation for driving the LCD during operation, associated gate oxide films are formed of a dual gate type. Also, the continuous trend toward ever-miniaturized line width requires the use of a shallow trench isolation (STI) process.

However, if the process for fabricating the dual gate oxide film is conducted in the same manner as it is applied to the STI structure, excessive numbers of STI recesses in the LV region are created during formation of the dual gate oxide film for the HV region, resulting in compromise of the overall device characteristics.

The source of the recesses lies in that since a CVD oxide film such as USG or HDP is used as a gap fill in the STI structure, and since a thermal oxide film is used as a gate oxide film, a severe dent is created in the boundary between the active region and the field region due to the difference in wet etch rate between the thermal oxide film and CVD oxide film.

This conventional process is explained in greater detail with reference to FIGS. 1a through 1c, which illustrate the process of fabricating the conventional dual gate oxide film.

For convenience' sake, the process is explained by being classified into 3 steps as follows.

In the drawings, reference symbol "I" indicates a first active region in which a thin gate oxide film for LV is formed and reference "II" indicates a second active region in which a thick gate oxide film for HV is formed.

First Step

Figure 1A:
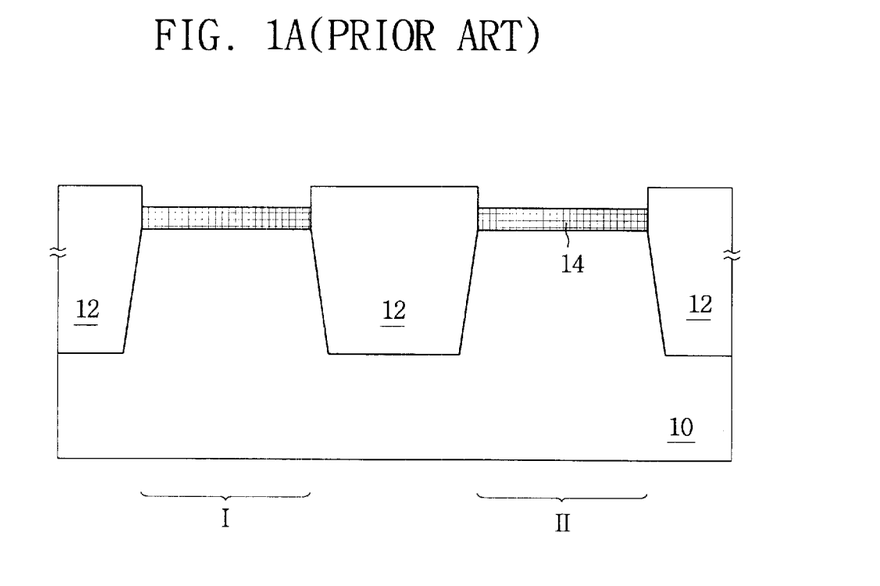
FIGS. 1a to 1c are process views showing a method of fabricating a dual gate oxide film according to a conventional method.

As shown in FIG. 1a, a nitride film pattern (not shown) is formed in the first and second active regions I, II of the substrate 10. The silicone substrate 10 is selectively etched to a predetermined thickness by using the pattern as mask so that trench (t) is formed in the field region within the substrate 10. The CVD oxide film of USG or HDP material is formed on the resultant material so that the trench (t) is sufficiently filled. Next, the CVD oxide film is chemically mechanically polished so that the nitride pattern in the first and second active regions I, II may remain and thereafter the nitride film is removed. The STI 12 that buries the inside of the trench (t) is thus formed. Subsequently, CMOS well ion-implantation and channel ion-implantation are performed. The first thermal oxide film 14 for HV is subsequently formed to a thickness of 300 Å in the active regions I, II on the substrate 10.

Second Step

Figure 1B:
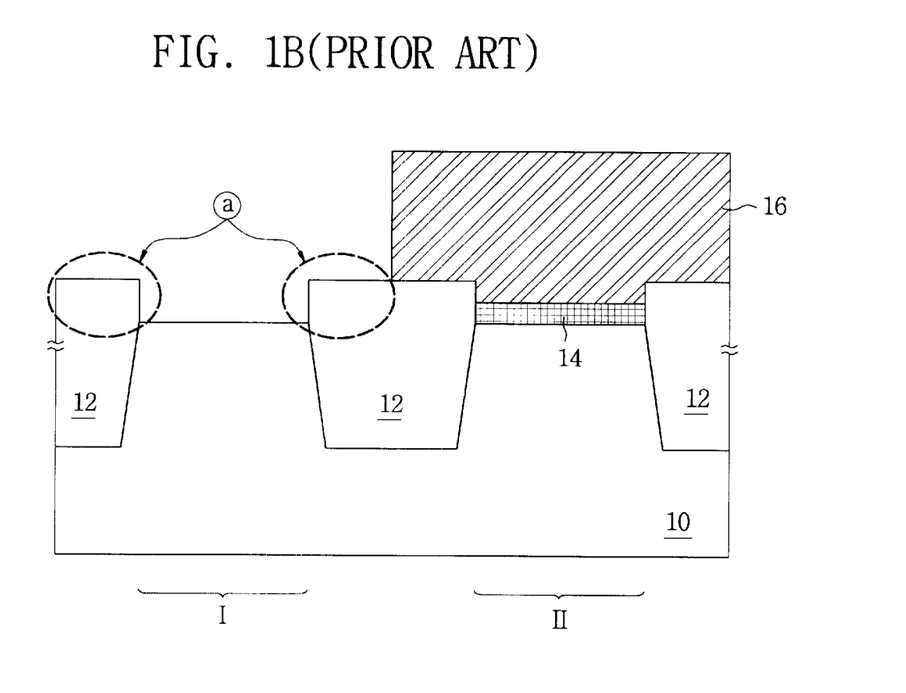

As shown in FIG. 1b, a photo-resist pattern 16 is formed on the resultant structure so that the first active region I and the surrounding STI 12 are partially exposed. The first thermal oxide film 14 is wet etched using the pattern as a mask and selectively remains only in the HV region II.

Third Step

Figure 1C:
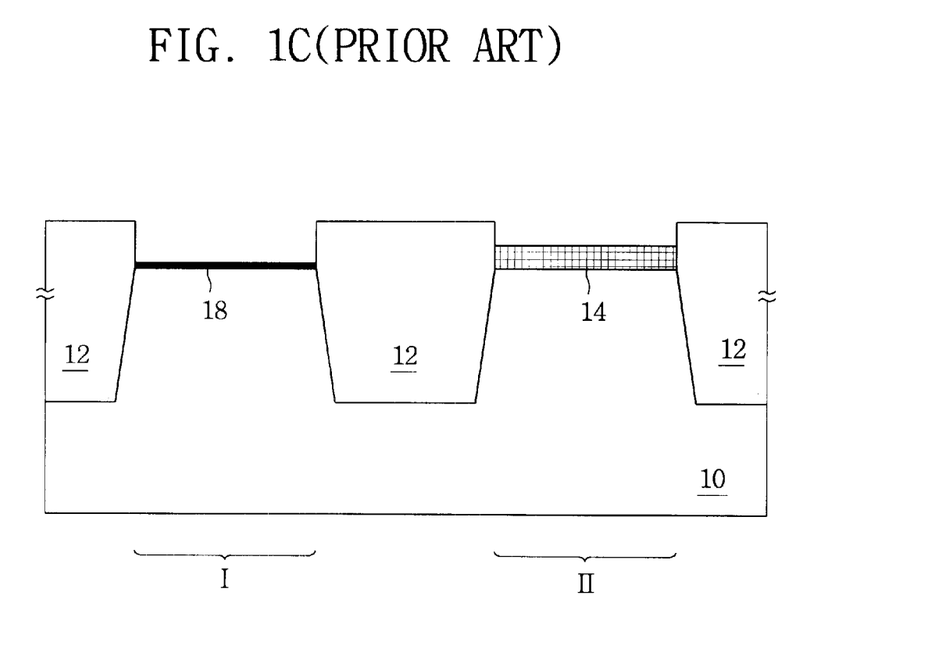

As shown in FIG. 1c, the photo-resist pattern 16 is removed and the second thermal oxide film 18 for LV is formed to a thickness of 40 Å in the first active region I. Thereby, the process for the dual gate oxide film is completed. In this process, when the second thermal oxide film 18 is formed, the first thermal oxide film 14 also grows to a small degree. However, since the amount of the growth is minor, the resultant effect is negligible.

As a result, the first active region I is formed therein with a relatively thin gate oxide film of the second thermal oxide film 18 material, which is suitable for the LV region. The second active region II is formed therein with a relatively thick gate oxide film of the first thermal oxide film 14 material, which is suitable for an HV region.

However, if the dual gate oxide film is formed through the aforementioned processes, a number of limitations result during the formation of device.

Figure 2:
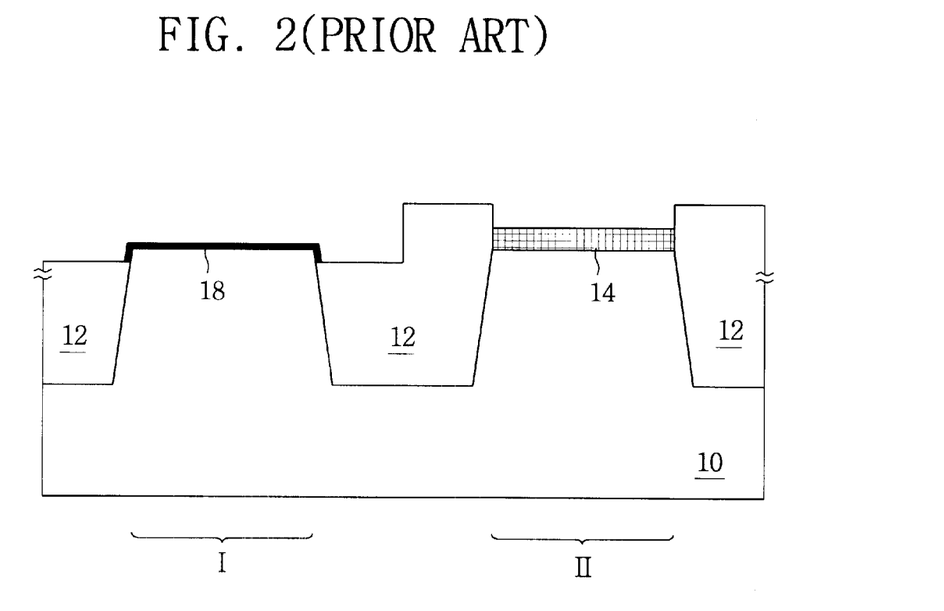
FIG. 2 is a cross-sectional view showing a defect occurs when the dual gate oxide film is formed according the processes shown in FIGS. 1a to 1c.

When the first thermal oxide film 14 of LV region I is removed by using the photo-resist pattern 16 as a mask, the STI 12, which is indicated by ⓐ in FIG. 1b, surrounding the perimeter of the LV region is recessed together with the first thermal oxide film 14. Accordingly, a dent is generated in the region, that is, in the region of the boundary surface between the active region and the field region. FIG. 2 shows the structure of a device having such defect.

Such a defect phenomenon is caused by the difference in a wet etch rate between the first thermal oxide film 14 being used as a gate oxide film and the CVD oxide film forming the STI 12. For example, in the case where the STI 12 is filled with a HDP material, the depth of recess is approximately 200 Å relative to the substrate 10 of the active region. In contrast, in the case where the STI 12 is filled with a USG material, the recess amounts to approximately 1,000 Å relative to the substrate 10 of the active region, thereby the dent is more severely created.

In the case where the dent is formed, poly residue remains in the region that is recessed during etching of the gate poly as a follow up process, or the gate poly surrounds the field region and the active region at the boundary between the field region and the active region. Each of these scenarios results in deterioration in the gate oxide film due to the concentration of electric field created in upward and sideward directions as well as deterioration in characteristics such as drop in threshold voltage Vth of a resulting transistor during the operation of device, increase in threshold voltage leakage, and decrease in punching margin.

In order to solve those problems, there has been disclosed a process technique by which a dual gate oxide film is formed using a nitride film without the need for removing the thick thermal oxide film of the LV region while the process of fabricating the dual gate oxide film is applied to a normal STI structure in LDI design.

FIGS. 3a through 3e sequentially illustrate a sequence of forming a dual gate oxide structure. The method comprises five steps as follows.

Reference symbol "I" indicates a LV region in which a relatively thin gate oxide film is formed, and reference symbol "II" indicates a HV region in which a relatively thick gate oxide film is formed.

First Step

Figure 3A:
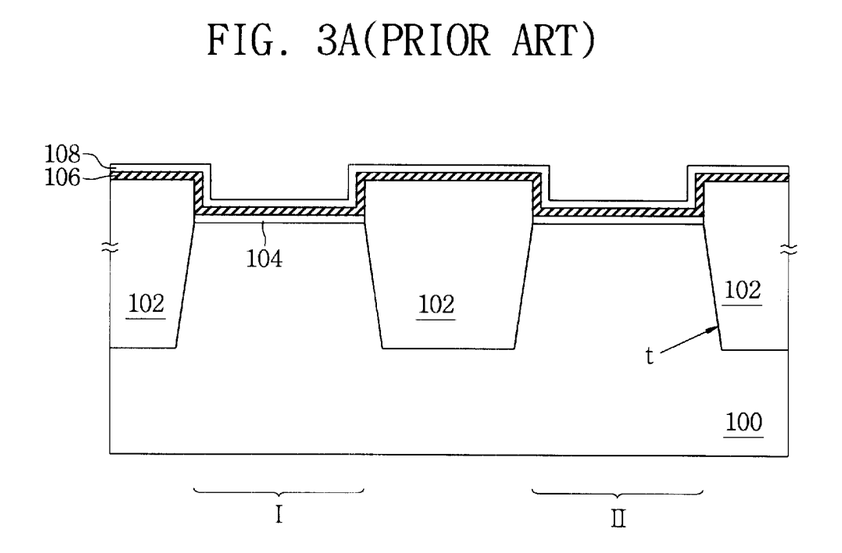
FIGS. 3a to 3e are process views showing a method of fabricating a dual gate oxide film according to another conventional method.

As shown in FIG. 3a, the STI 102 of the CVD oxide film material that buries the inside of the trench (t) is formed in the field region on the silicone substrate 100 by the same method as shown in FIG. 1a. The buffer oxide film 104 of the thermal oxide film material is subsequently formed in the active regions I, II on the substrate 100 and CMOS well ion-implantation and channel ion-implantation are performed. While the buffer oxide film 104 remains, the nitride film 106 is formed on the buffer oxide film 104 including the STI 102. Thereafter, the CVD oxide film 108 of medium temperature oxide (MTO) is formed on the resultant material. Here, the MTO refers to an oxide film that is formed at the temperature of 700 to 800° C. The buffer oxide film 104 is formed at a thickness of 100 to 120 Å, the nitride film 106 is formed at a thickness of 90 to 110 Å and the CVD oxide film 108 is formed at a thickness of 90 to 110 Å.

Second Step

Figure 3B:
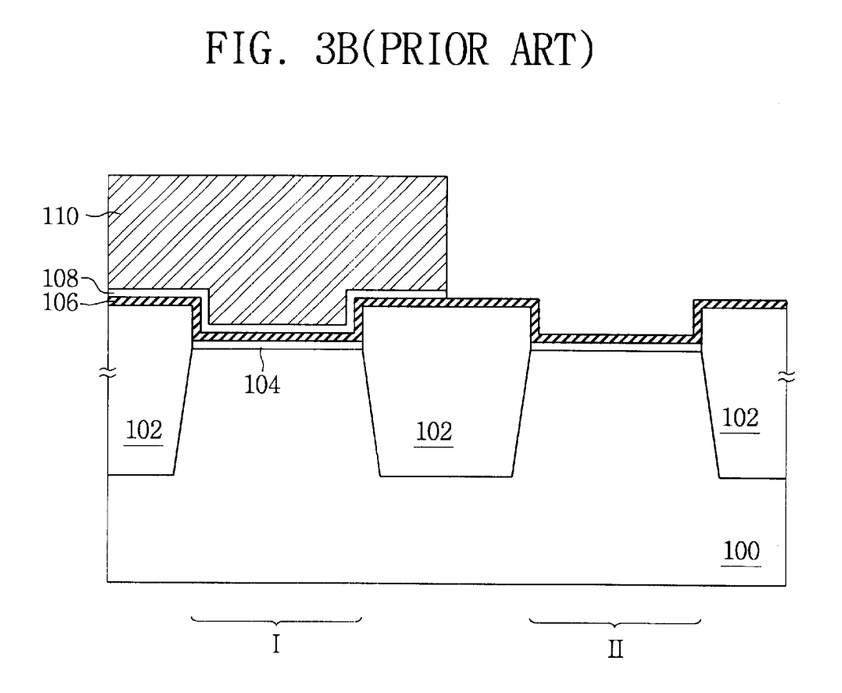

As shown in FIG. 3b, the CVD oxide film 108 is patterned by a photo-resist pattern 110 so that the first active region I and the surrounding STI 102 are partially masked. The second active region II and the adjacent CVD oxide film 108 are wet etched with the pattern 110 as a mask.

Figure 3C:
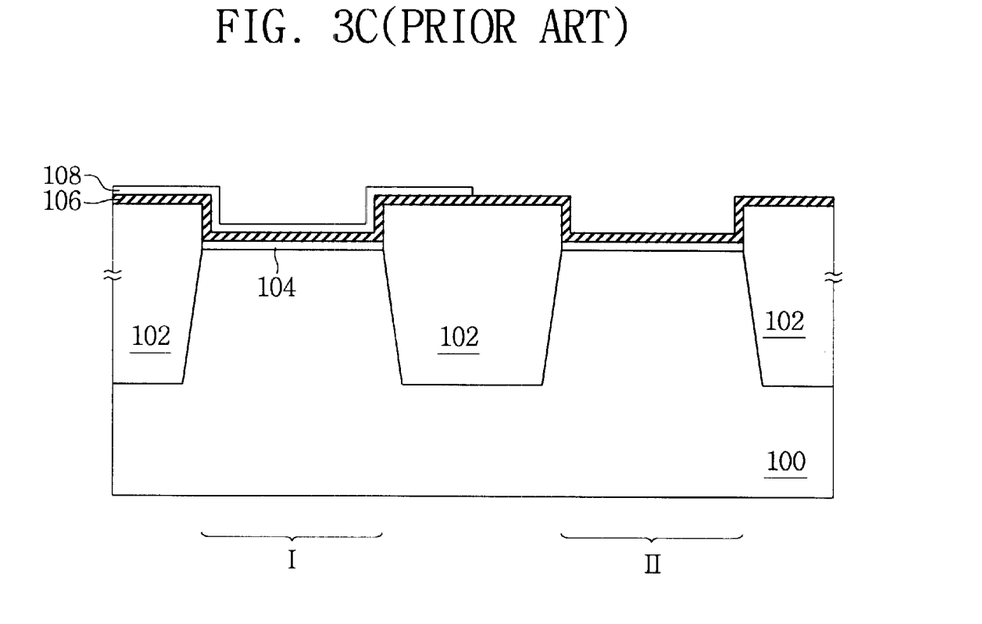

During the third step shown in FIG. 3c, the photo-resist pattern 110 is removed.

Figure 3D:
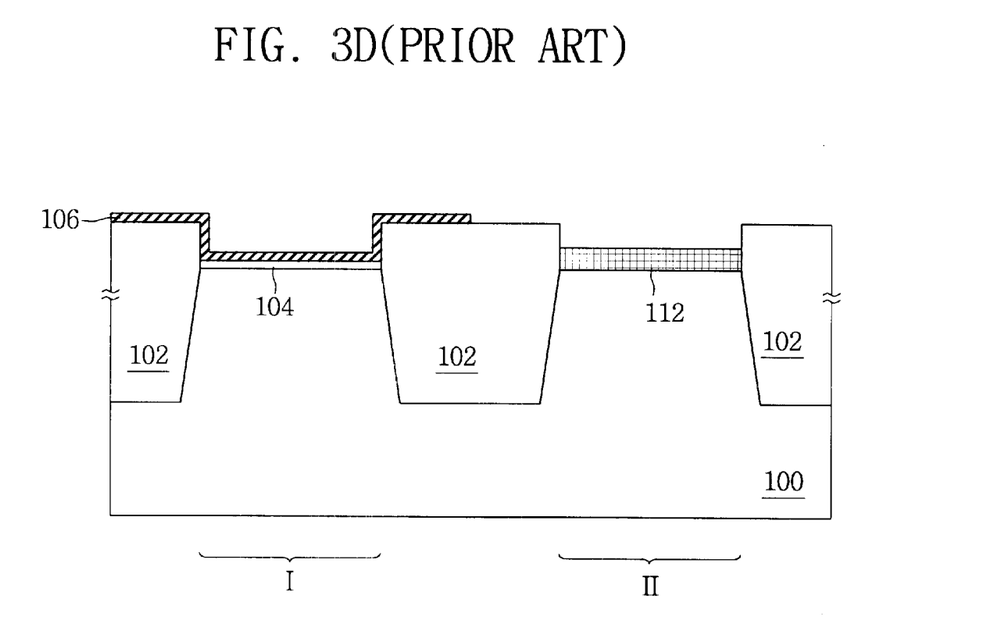

During the fourth step shown in FIG. 3d, the nitride film 106 and the buffer oxide film 104 are in order etched by utilizing, as a mask, the residual CVD oxide film 108, thereby exposing the surface of the second active region II. At this time, the nitride film 104 is etched by a wet etching method in which phosphoric acid is used as etchant.

The residual CVD oxide film 108 that used as a mask is simultaneously removed when the buffer oxide film 104 is etched. The first thermal oxide film 112 is formed at a thickness of 400 to 450 Å on the exposed surface of the second active region II.

Figure 3E:
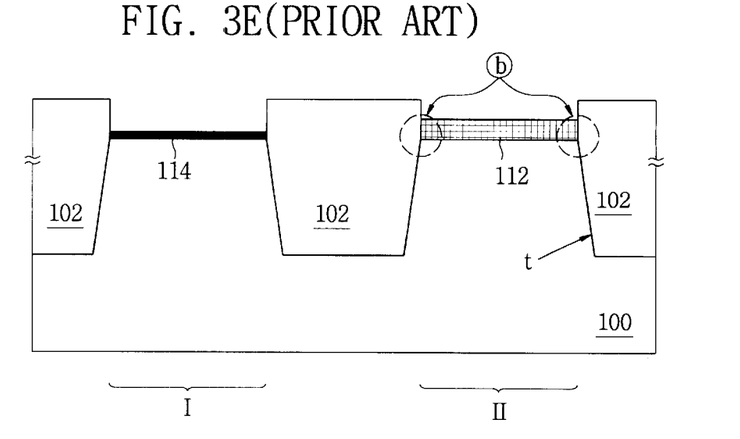

During the fifth step shown in FIG. 3e, the nitride film 106 and the buffer oxide film 104 that remain in the first active region I and the adjacent STI 102 are in order etched, thereby exposing the surface of the first active region I.

In this case, since a portion of the first oxide film 112 is also consumed during the etching process (particularly, etching of the buffer oxide film), the first thermal oxide film 112 only remains in a thickness of approximately 250 to 350 Å on the second active region II when the etching processes on the residual films are completed. The second thermal oxide film 114 is formed in a thickness of 30 to 50Å, thinner than the first thermal film 112 on the exposed surface of the first active region I. Thereby, the processes for the dual gate oxide film are completed. Again, in this example, when the second thermal oxide film 114 is formed, the first thermal oxide film 112 of the second active region II also grows to a small degree. However, since the amount of the growth is minor, the resultant effect is negligible.

As a result, the first active region I is formed therein with a thin gate oxide film for LV of the second thermal film 114 material, and the second active region II is formed therein with a thick gate oxide film for HV of the first thermal film 112 material.

In the case that the dual gate oxide film is fabricated according to such a method, dents can be prevented from being created at the boundary between the active region and field region because the process of removing the thick thermal oxide film in the LV region is not needed during the formation of the thick gate oxide film in the HV region.

Figure 4:
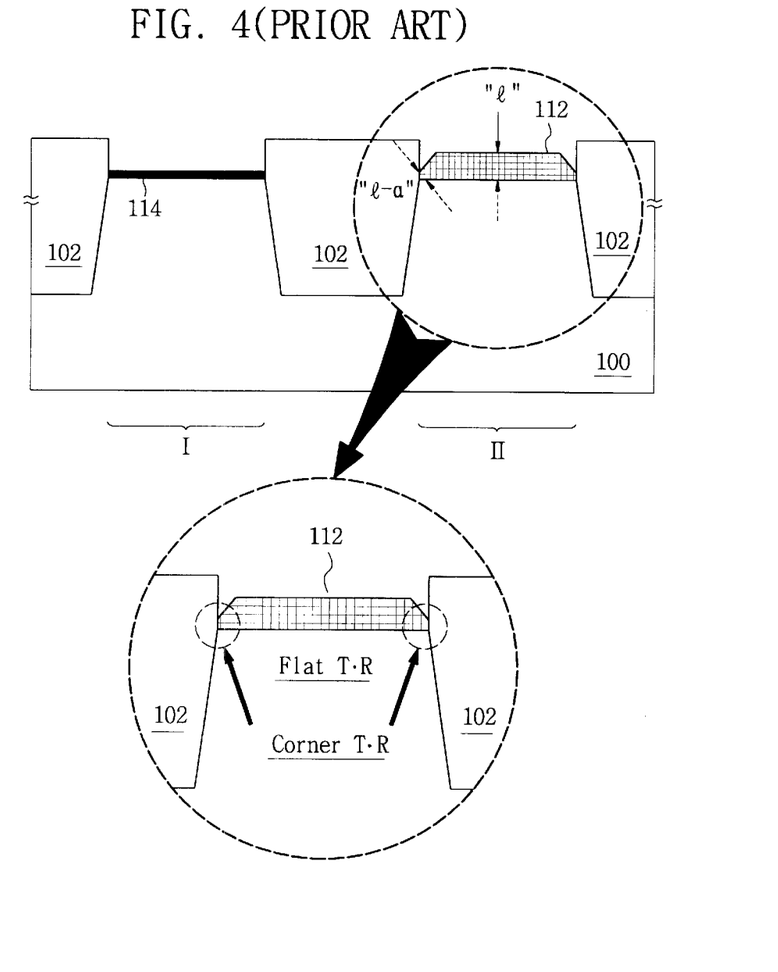
FIG. 4 is a cross sectional view showing a defect that occurs when the dual gate oxide film is formed according the processes shown in FIGS. 3a to 3c.

However, when the thick gate oxide film of the first thermal oxide film 112 grows in the second active region II by using the nitride film 106 as a mask during this process, there is a problem in that the first thermal oxide film 112 grows to a relatively thinner degree in the boundary region (indicated by ⓑ in FIG. 3e) between the STI 102 and the active region, than in other adjacent portions. That is, the first thermal oxide film 112 is critically thin at the edge portion of the STI 102. The thicker the gate oxide film, the more pronounced the phenomenon. FIG. 4 shows the structure of the device including such a defect. In the drawing, the symbol "l" indicates the predetermined thickness of the first thermal oxide film 112, and "l-α" indicates the thickness of the first oxide film 112 at the boundary as a result of the thinning phenomenon.

The thinning phenomenon arises due to the fact that compressive stress is concentrated on the side of the STI 102 that is relatively stiff during the thermal oxidation process. When such a thinning phenomenon occurs, the resulting gate oxide film is deteriorated due to the concentration of electric field. In addition, a transistor is commonly formed at the center of the active region with channels (the channel of flat TR) and turned-on just after a transistor is first formed at the boundary of the active region and field region with channels (the channel of corner TR) and turned-on. This phenomenon, referred to as the "hump" phenomenon, causes the resulting transistor to appear as though it has two threshold voltage Vth values, which should be avoided.

SUMMARY OF THE INVENTION

Accordingly, it is an object of the present invention to provide a semiconductor device fabricating method by which the LOCOS profile characteristic is applied to an edge portion of a STI in an HV region to thereby lower compressive stress that is concentrated on the side of the STI. As a result, the present invention prevents a thinning phenomenon of a gate oxide film at edge portions of the STI that would otherwise occur when the gate oxide film for HV grows in a normal STI structure by utilizing a nitride film as a mask. This prevents compromise of the operational characteristics, which otherwise would be caused by the concentration of electric field, combined with the hump phenomenon.

In order to achieve the above object, the present invention is directed to a semiconductor device fabricating method. A semiconductor substrate is formed having a first active region and a second active region that are isolated by a shallow trench isolation (STI) structure. A buffer oxide film is formed in the first and second active regions on the substrate and a nitride film is formed on the buffer oxide film and the STI. A first photo-resist pattern s formed on the nitride film to expose a portion of the STI and edges of the adjacent second active region. Unmasked portions of the buffer oxide film and the nitride film are etched to open the edges of the second active region to a predetermined size, and thereafter the first photo-resist pattern is removed. A field oxide film is formed in contact with the STI on the opened portion of the second active region by performing an oxidation process using residual nitride film as a mask. A CMOS well ion-implantation and a channel ion-implantation are the performed and a CVD oxide film is formed on the resultant structure. A second photo-resist pattern is formed on the CVD oxide film to mask a portion the STI and the adjacent first active region, and the CVD oxide film that is not masked by the second photo-resist pattern is etched to thereafter remove the second photo-resist pattern. The nitride film and buffer oxide film are then etched by utilizing the residual CVD oxide film as a mask so that the nitride film and buffer oxide film remain in the first active region and are opened in the second active region. A first thermal oxide film for a gate oxide film is formed on the second active region, and the nitride film and the oxide film that remain in the first active region are then etched to thereby open the first active region. A second thermal oxide film for a gate oxide film is formed at a thickness less than the thickness of the first thermal oxide film on the opened portion of the first active region.

In a preferred embodiment, the STI is formed with a CVD oxide film of USG or HDP. The nitride film is preferably formed at a thickness ranging from 50 to 3,000 Å. The field film is preferably formed at a thickness ranging from 100 to 4,000 Å. The first thermal oxide film is preferably formed at a thickness ranging from 80 to 1,000 Å. The second thermal oxide film is preferably formed at a thickness ranging from 30 to 50 Å. The buffer oxide film is preferably formed of a thermal oxide film material. The CVD oxide film is preferably formed of a MTO (Medium Temperature Oxide) material. The MTO (Medium Temperature Oxide) is preferably formed at the temperature ranging from 700 to 800° C.

The first active region may comprise a LV region, and the second active region may comprise a HV region. The HV region may be designed to operate at an internal voltage of 3.3 to 50 V.

According to the aforementioned method, since the processes of fabricating the gate oxide film for HV are performed such that a field oxide film is additionally formed on the edge portion of STI for HV, compressive stress that is concentrated on the sides of the relatively stiff STI during the oxide process can be lowered relative to the conventional technique, thereby preventing the gate oxide film for HV from being thinned at edge portions of the STI.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF PREFERRED EMBODIMENTS

Hereinafter, a preferred embodiment will be explained in detail with reference to the accompanying drawings.

Referring to FIGS. 5a to 5f that illustrate a method of fabricating a dual gate oxide film according to the present invention, the method is explained by being divided into the following six steps.

Reference symbol "I" indicates the first active region that is to be used as a LV region (in which a relatively thin gate oxide film is formed). Reference symbol "II" indicates the second active region that is to be used as a HV region (in which a relatively thick gate oxide film is formed). The HV region is a region in which an operational voltage is in the range of 3.3 to 50 V.

First Step

Figure 5A:
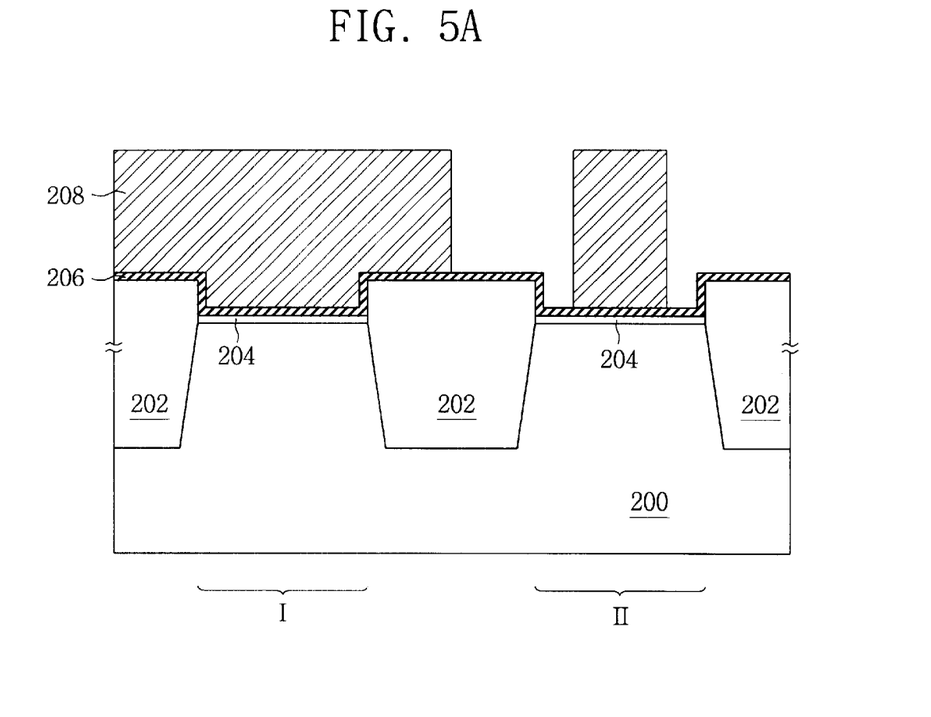
FIGS. 5a to 5f are process views showing a method of fabricating a dual gate oxide film according to the present invention.

As shown in FIG. 5a, a nitride film pattern (not shown) is formed in the first and second active regions I, II of the substrate 200. The silicone substrate 200 is selectively etched to a predetermined thickness by using the pattern as a mask so that trench (t) is formed in the field region within the substrate 200. The CVD oxide film of USG or HDP material is deposited on the resultant structure so that the trench (t) is sufficiently filled. Next, the CVD oxide film is chemically mechanically polished so that the nitride pattern partially remains and thereafter the residual nitride film is removed. Thereby, the STI 202 that buries the inside of the trench (t) is formed. Subsequently, the buffer oxide film 204 of the thermal oxide film is formed in the first and second active regions on the substrate 200, and the nitride film 206 is formed to a thickness of 50 to 3000 Å on the STI 202 and the buffer oxide film 204. The first photo-resist pattern 208 is formed on the nitride film 206 to partially open both edges of the second active region II and the adjacent STI 202.

Second Step

Figure 5B:
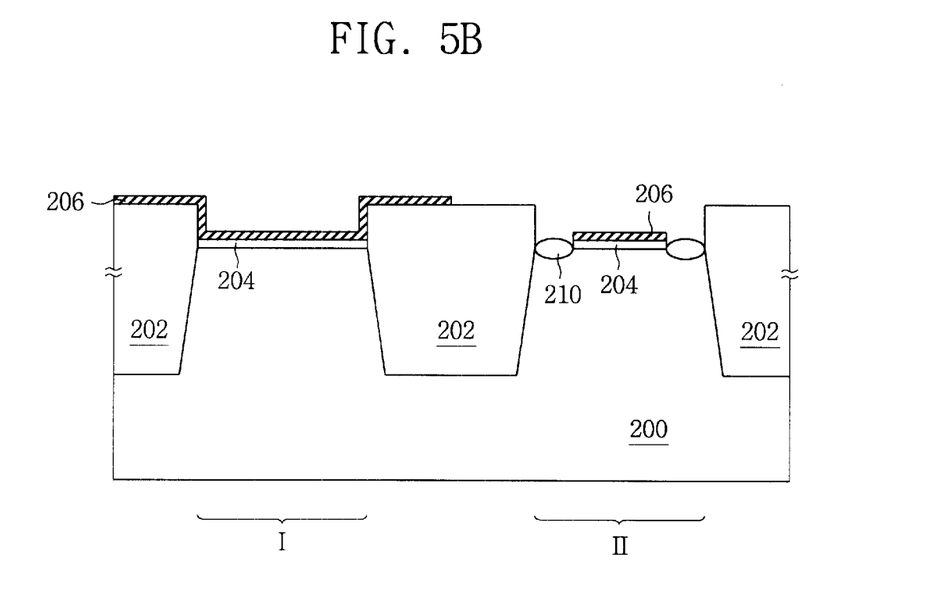

As shown in FIG. 5b, the nitride film 206 and buffer oxide film 204 are sequentially etched by utilizing the photo-resist pattern 208 as a mask so that both edges of the second active region II are opened to a predetermined thickness. Following this, the photo-resist pattern 208 is removed.

An oxidation process is performed by utilizing the residual nitride film 206 as a mask so that the field oxide film in contact with edge portion of the STI 202 is selectively formed in exclusively the open portion of the second active region. Thereafter, CMOS well ion-implantation and channel ion-implantation are performed. At this time, it is desirable that the field oxide film 210 is formed in a thickness of 100 to 4000 Å.

As described above, the field oxide film 210 is additionally formed at the boundary of the STI 202 and second active region II so that the edge portion of the STI 202 may be protected by the thick field oxide film 210. Thereby, compressive stress that is concentrated on the side of the STI 202 during a subsequent oxidation process can be lowered, preventing the gate oxide film from being reduced at this portion.

Figure 5C:
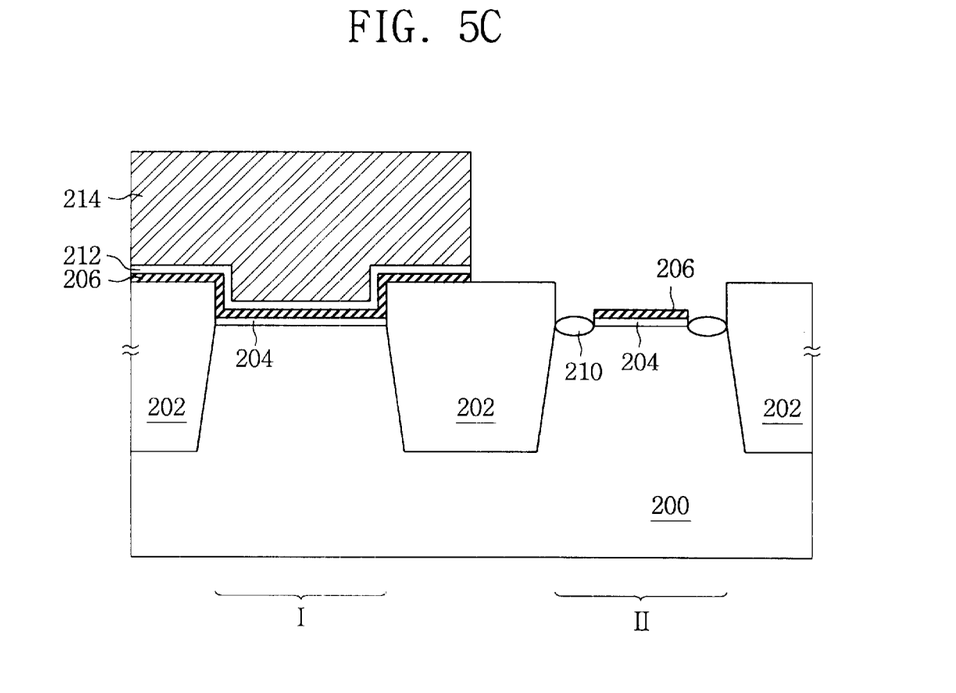

During the third step shown in FIG. 5c, a CVD oxide film 212 of medium temperature oxide (MTO) is formed on the resultant material. The second photo-resist pattern 214 is formed on the CVD oxide film 212 so that the first active region I and the STI 202 adjacent to the first active region I may be partly masked. Next, the portion of the CVD oxide film 212 that is not masked by the photo-resist pattern 214 is etched. Here, the MTO refers to an oxide film that is formed at the temperature of 700 to 800° C.

Figure 5D:
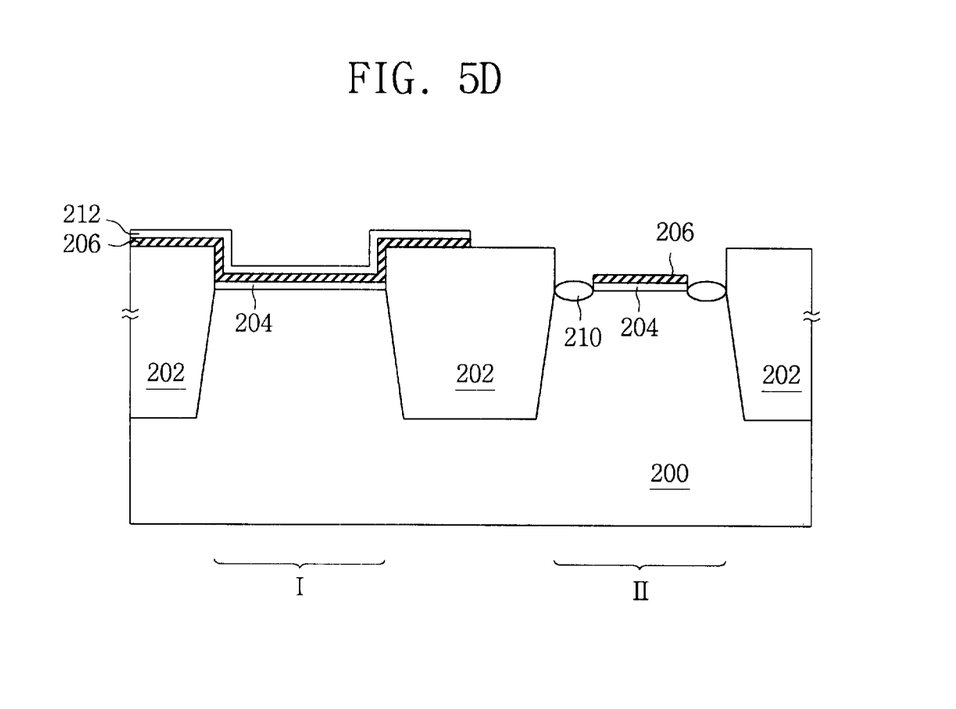

During the fourth step shown in FIG. 5d, the second photo-resist pattern 214 is removed.

Figure 5E:
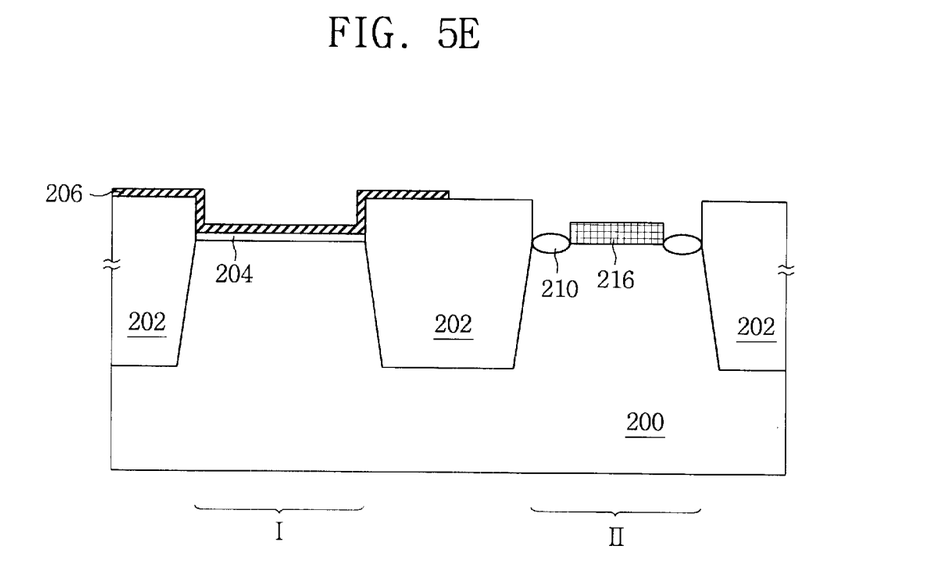

During the fifth step shown in FIG. 5e, the nitride film 206 and the buffer oxide film 204 in the second active region II are sequentially etched by utilizing a mask of the residual CVD oxide film 212. Thereby, the nitride film 206 and buffer film 204 remain in the first active region I, and the substrate 200 is exposed in the second active region II.

The reason that only the CVD oxide film 208 and the nitride film 206 remain in the first active region I is that the residual CVD oxide film 212 is simultaneously removed when the buffer oxide film 204 of the second active region II is etched.

Figure 5F:
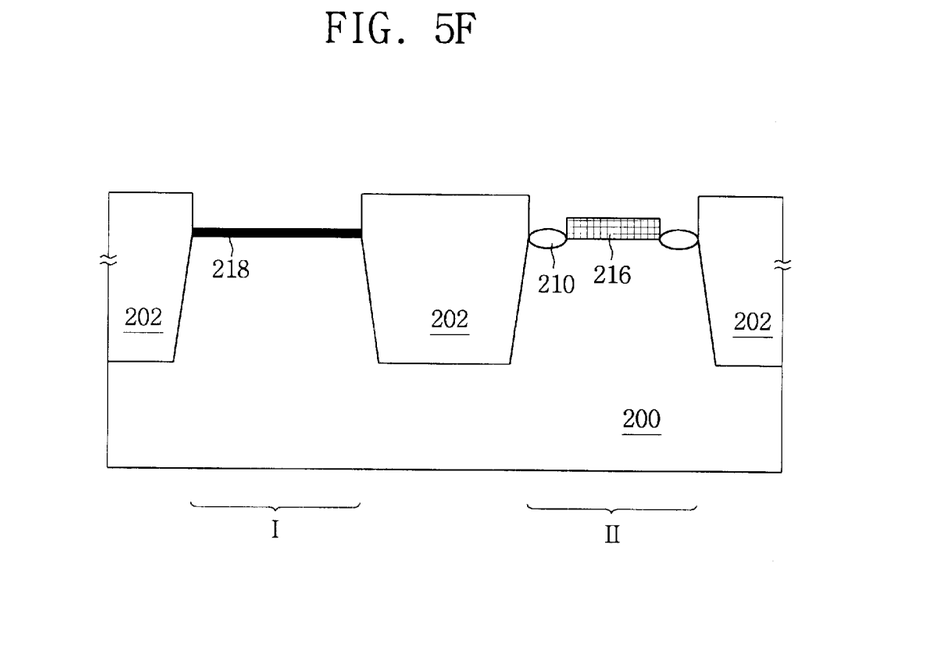

As the fifth step shown in FIG. 5f, a first oxide film 216 is formed to a thickness of 80 to 1000 Å in the exposed surface of the second active region II, and the nitride film 206 and the buffer oxide film 104 that remain above the first active region I and a portion of the STI 202 adjacent to the region I are in order etched, thereby exposing the substrate 200 of the first active region I. Since a portion of the first thermal oxide film 216 is also consumed during the etching process, the first thermal oxide film 216 remains at a thickness less than 80 to 1,000 Å when the etching process on the residual films is completed. Also, the second thermal oxide film 218 is formed to a thickness of 30 to 50Å, which is less that that of the first thermal film 216 on the exposed surface of the first active region I. Thereby, the process for forming the dual gate oxide film is completed. Here, when the second thermal oxide film 218 is formed, the first thermal oxide film 216 of the second active region II also grows to an additional degree. However, since the amount of the growth is minor, the resultant effect is negligible.

As a result, the first active region I is formed therein having a relatively thin gate oxide film for LV of the second thermal film 218 material, and the second active region II is formed therein having a thick gate oxide film for HV of the first thermal film 216 material.

Under such a process, since the gate oxide film for the HV region is formed in an oxidation process in a condition where the field oxide film 210 is previously formed at an edge portion of STI 202 in the second active region II (HV region), compressive stress that is concentrated on the sides of the STI 202 during the oxidation process can be lowered by utilizing the field oxide film 210.

Accordingly, the method of fabricating the semiconductor device according to the present invention prevents the above-described thinning phenomenon of the gate oxide film at the edge portions of the second active region II and STI 202. The method of the present invention prevents the concentration of electric field and hump phenomenon that are created during the operation of device, thereby preventing compromise of the operational characteristics of a resulting transistor and deterioration of the gate oxide film.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A semiconductor device fabricating method, comprising the steps of:

forming a semiconductor substrate having a first active region and a second active region that are isolated by a shallow trench isolation (STI) structure;

forming a buffer oxide film in the first and second active regions on the substrate;

forming a nitride film on the buffer oxide film and the STI;

forming a first photo-resist pattern on the nitride film to expose a portion of the STI and edges of the adjacent second active region;

etching unmasked portions of the buffer oxide film and the nitride film to open the edges of the second active region to a predetermined size, and thereafter removing the first photo-resist pattern;

forming a field oxide film in contact with the STI on the opened portion of the second active region by performing an oxidation process using residual nitride film as a mask;

performing a CMOS well ion-implantation and a channel ion-implantation;

forming a CVD oxide film on the resultant structure;

forming a second photo-resist pattern on the CVD oxide film to mask a portion the STI and the adjacent first active region;

etching the CVD oxide film that is not masked by the second photo-resist pattern to thereafter remove the second photo-resist pattern;

etching the nitride film and buffer oxide film by utilizing the residual CVD oxide film as a mask so that the nitride film and buffer oxide film remain in the first active region and are opened in the second active region;

forming a first thermal oxide film for a gate oxide film on the second active region;

etching the nitride film and the oxide film that remain in the first active region to thereby open the first active region; and forming a second thermal oxide film for a gate oxide film at a thickness less than the thickness of the first thermal oxide film on the opened portion of the first active region.

2. The method as defined in claim 1, wherein the STI is formed with a CVD oxide film of USG or HDP.

3. The method as defined in claim 1, wherein the nitride film is formed at a thickness ranging from 50 to 3,000 Å.

4. The method as defined in claim 1, wherein the field film is formed at a thickness ranging from 100 to 4,000 Å.

5. The method as defined in claim 1, wherein the first thermal oxide film is formed at a thickness ranging from 80 to 1,000 Å.

6. The method as defined in claim 1, wherein the second thermal oxide film is formed at a thickness ranging from 30 to 50 Å.

7. The method as defined in claim 1, wherein the buffer oxide film is formed of a thermal oxide film material.

8. The method as defined in claim 1, wherein the CVD oxide film is formed of a MTO (Medium Temperature Oxide) material.

9. The method as defined in claim 8, wherein the MTO (Medium Temperature Oxide) is formed at the temperature ranging from 700 to 800° C.

10. The method as defined in claim 1, wherein the first active region is a LV region, and the second active region is a HV region.

11. The method as defined in claim 10, wherein the HV region is designed to operate at an internal voltage of 3.3 to 50 V.

* * * * *